United States Patent [19]

Matsubayashi et al.

[11] Patent Number: 5,600,228

[45] Date of Patent: Feb. 4, 1997

[54] POWER MANAGING APPARATUS AND METHOD

[75] Inventors: Kazuhiro Matsubayashi, Yokohama; Kazutoshi Shimada, Yokosuka; Eisaku Tatsumi, Yokohama; Shigeki Mori, Koshigaya; Shinichi Sunakawa, Kawasaki; Takashi Harada, Yokohama; Katsuhiko Nagasaki, Ichikawa, all of Japan

[73] Assignee: Canon Kabushiki Kaisha, Tokyo, Japan

[21] Appl. No.: 280,990

[22] Filed: Jul. 27, 1994

[30] Foreign Application Priority Data

Jul. 29, 1993 [JP] Japan .................................. 5-207237

[51] Int. Cl.[6] .............................. H02J 7/04; H02J 7/16
[52] U.S. Cl. ................................ 320/43; 320/22; 320/31; 320/48; 320/37
[58] Field of Search .......................... 320/22, 43, 24, 320/58–60, 37, 31, 48; 364/707

[56] References Cited

U.S. PATENT DOCUMENTS

| | | |
|---|---|---|
| 3,922,526 | 11/1975 | Cochran .................................. 364/707 |
| 4,409,665 | 10/1983 | Tubbs ...................................... 364/707 |
| 4,488,554 | 12/1984 | Nappholz et al. ....................... 128/419 |
| 4,649,373 | 3/1987 | Bland et al. ............................. 364/707 |
| 5,065,357 | 11/1991 | Shiraishi et al. ........................ 364/707 |
| 5,182,655 | 1/1993 | Motoyanagi ............................ 340/636 |
| 5,390,350 | 2/1995 | Chung et al. ........................... 364/707 |
| 5,396,443 | 3/1995 | Mese et al. ............................. 364/707 |
| 5,416,726 | 5/1995 | Garcia-Duarte et al. ............... 364/707 |
| 5,455,499 | 10/1995 | Uskali et al. ............................ 320/43 |

FOREIGN PATENT DOCUMENTS 0207054  12/1986  European Pat. Off. .

Primary Examiner—Peter S. Wong
Assistant Examiner—K. Shin
Attorney, Agent, or Firm—Fitzpatrick, Cella, Harper & Scinto

[57] ABSTRACT

A power managing apparatus in an electronic apparatus using a battery comprises a residual power quantity detector for detecting a residual quantity of the battery; a time setter for setting a time; a judging unit for judging whether the electronic apparatus can be driven until the set time or not on the basis of the detected residual quantity of the battery; and an alarm display for notifying the result of the judgment. The set time is an operable time of the electronic apparatus or an operable time obtained from the next charging time or can be input by a pen.

27 Claims, 13 Drawing Sheets

| BATTERY | QUANTITY OF POWER |
|---------|-------------------|
| MANGANESE | 5 (WH) |
| ALKALINE | 10 (WH) |

| CLOCK | POWER CONSUMED | OPERABLE TIME ||
| --- | --- | --- | --- |
| | | BATTERY (5WH) | BATTERY (10WH) |
| 4 (MHz) | 1.5 (W) | 3H20M | 6H40M |
| 8 (MHz) | 2.0 (W) | 2H30M | 5H |
| 16 (MHz) | 3.0 (W) | 1H40M | 3H20M |
| 32 (MHz) | 5.0 (W) | 1H | 2H |

POWER MANAGING APPARATUS AND METHOD

BACKGROUND OF THE INVENTION

1. Field of the Invention

The present invention relates to a power managing apparatus which manages an electric power consumption of a power source in an electronic apparatus.

2. Related Background Art

Hitherto, in order to reduce a power consumption in an electronic apparatus, its performance is purposely deteriorated to a level lower that the conventional one.

For example, in case of an electronic apparatus having a switch for switching a clock frequency, a power consumption can be reduced by decreasing the clock frequency.

In case of an electronic apparatus having a dial which changes a luminance of a display screen, a power consumption can be reduced by decreasing the luminance.

In the above conventional apparatuses, however, since the clock frequency or the luminance of the display screen is manually switched, particularly, in a portable apparatus which is driven by a battery, it is difficult to adjust an electric power to enable the battery to be used until the battery is replaced at the next time or the battery is charged. Due to this, there is a drawback such that a power quantity of the battery is extinguished earlier than it is expected or, on the contrary, the performance is excessively suppressed in spite of the fact that a power quantity of the battery still remains.

SUMMARY OF THE INVENTION

The present invention is made in consideration of the above situations and it is an object of the invention to provide a power manager which can supply an electric power for at least a set time.

According to the present invention, the above object is accomplished by a power managing apparatus which manages a power consumption of a power source in an electronic apparatus, wherein the apparatus comprises: setting means for setting a time until a next power source is supplied; first calculating means for obtaining a residual amount of a power quantity of the power source; second calculating means for obtaining a power consumption capable of supplying a power for a time which was set by the setting means on the basis of the residual amount of the power quantity obtained by the first calculating means; and managing means for managing a performance of the electronic apparatus in a manner such that a power which is actually consumed does not exceed the power consumption obtained by the second calculating means.

According to the power managing apparatus having the above construction, assuming that the time until the next power source is supplied is set by the setting means, the first calculating means obtains the residual amount of the power quantity of the power source. The second calculating means obtains the power consumption capable of supplying a power for the time which was set by the setting means on the basis of the residual amount of the power quantity. The managing means manages the performance of the electronic apparatus so that the power which is actually consumed does not exceed the power consumption obtained by the second calculating means. Due to this, the power can be supplied for at least the set time.

DETAILED DESCRIPTION OF THE PREFERRED EMBODIMENTS

An embodiment of the present invention will be described in detail hereinbelow with reference to the drawings.

Figure 2:
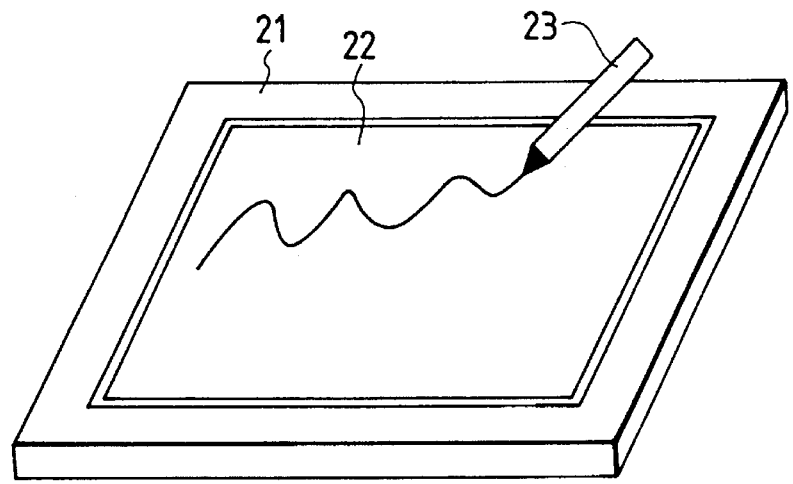
FIG. 2 is an external view of an electronic apparatus to which the power manager of the invention is applied.
Figure 3:
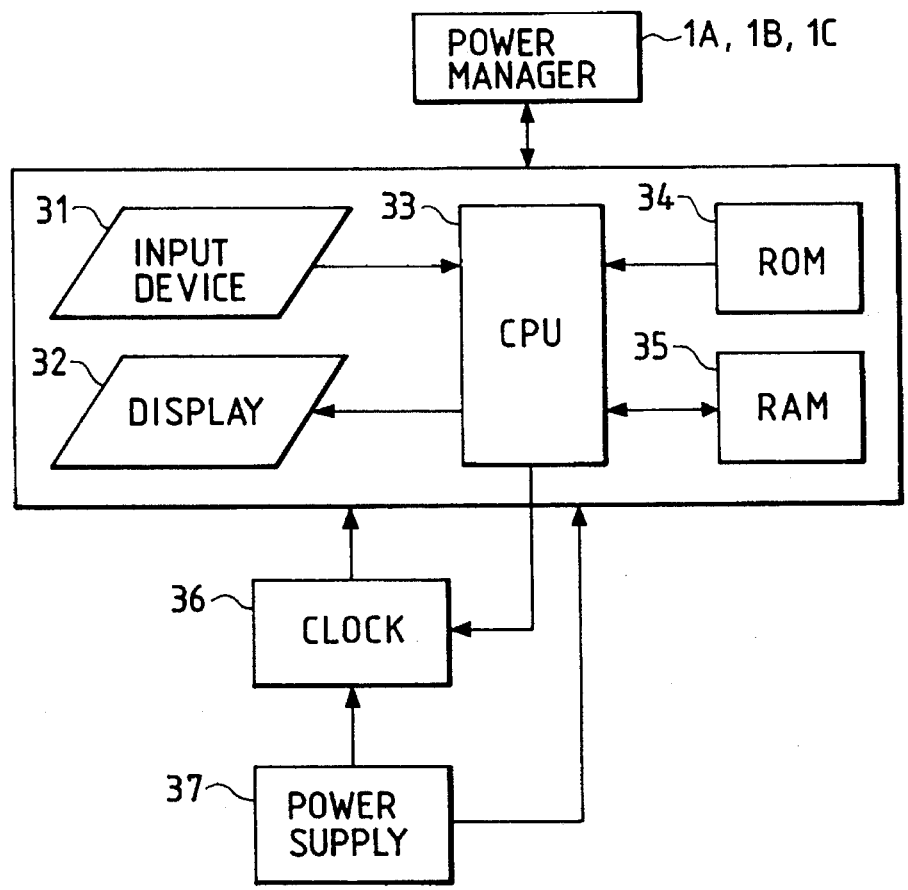
FIG. 3 is a block diagram of a hardware of the electronic apparatus shown in FIG. 2.

FIG. 2 is an external view of an electronic apparatus to which a power manager of the invention is applied and FIG. 3 is a hardware block diagram of the electronic apparatus.

The electronic apparatus has a thin rectangular casing 21, a coordinates plane 22 provided on the surface of the casing 21, and a pen 23 to write onto the coordinates plane.

As shown in FIG. 3, the casing 21 has therein: a CPU 33 to process information; an ROM 34 to store fixed information; an RAM 35 to store variable information; a clock 36 to give an operating clock of a system; a power supply 37 to supply a power; and power managers 1A, 1B, and 1C of the first, second, and third embodiments, which will be described hereinafter.

As shown in FIG. 3, the coordinates plane 22 comprises an input device 31 such as a transparent digitizer and a display device 32 such as a liquid crystal display which is arranged under the input device 31 so as to overlap thereon. It is possible to input by writing onto the input device 31 by the pen 23.

Figure 4:
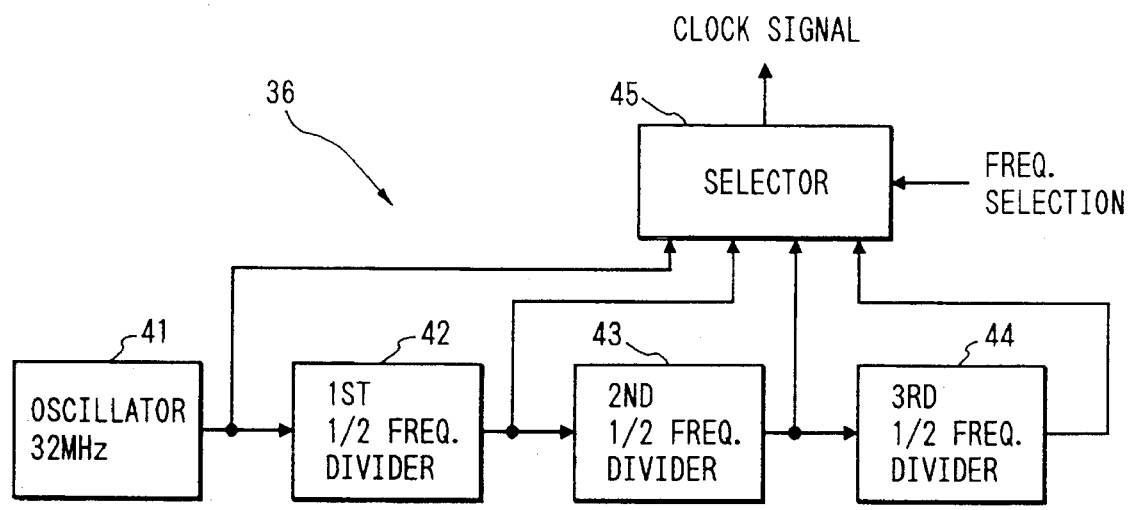
FIG. 4 is an internal constructional diagram of a clock.

As shown in an internal constructional diagram of FIG. 4, the clock 36 comprises: an oscillator 41 for generating a clock of 32 MHz; first, second, and third ½ frequency dividers 42, 43, and 44 each for dividing a frequency of the input clock into ½ and generating; and a selector 45. The clock of 32 MHz from the oscillator 41, the clock of 16 MHz which was frequency divided by the first ½ frequency divider 42, the clock of 8 MHz which was frequency divided by the second ½ frequency divider 43, and the clock of 4 MHz which was frequency divided by the third ½ frequency divider 44 are supplied to the sector 45, respectively. The selector 45 selects the clock of either one of the above frequencies on the basis of a frequency selection signal from a clock selector 8 of the first, second, and third power managers 1A, 1B, and 1C and generates.

Figure 1:
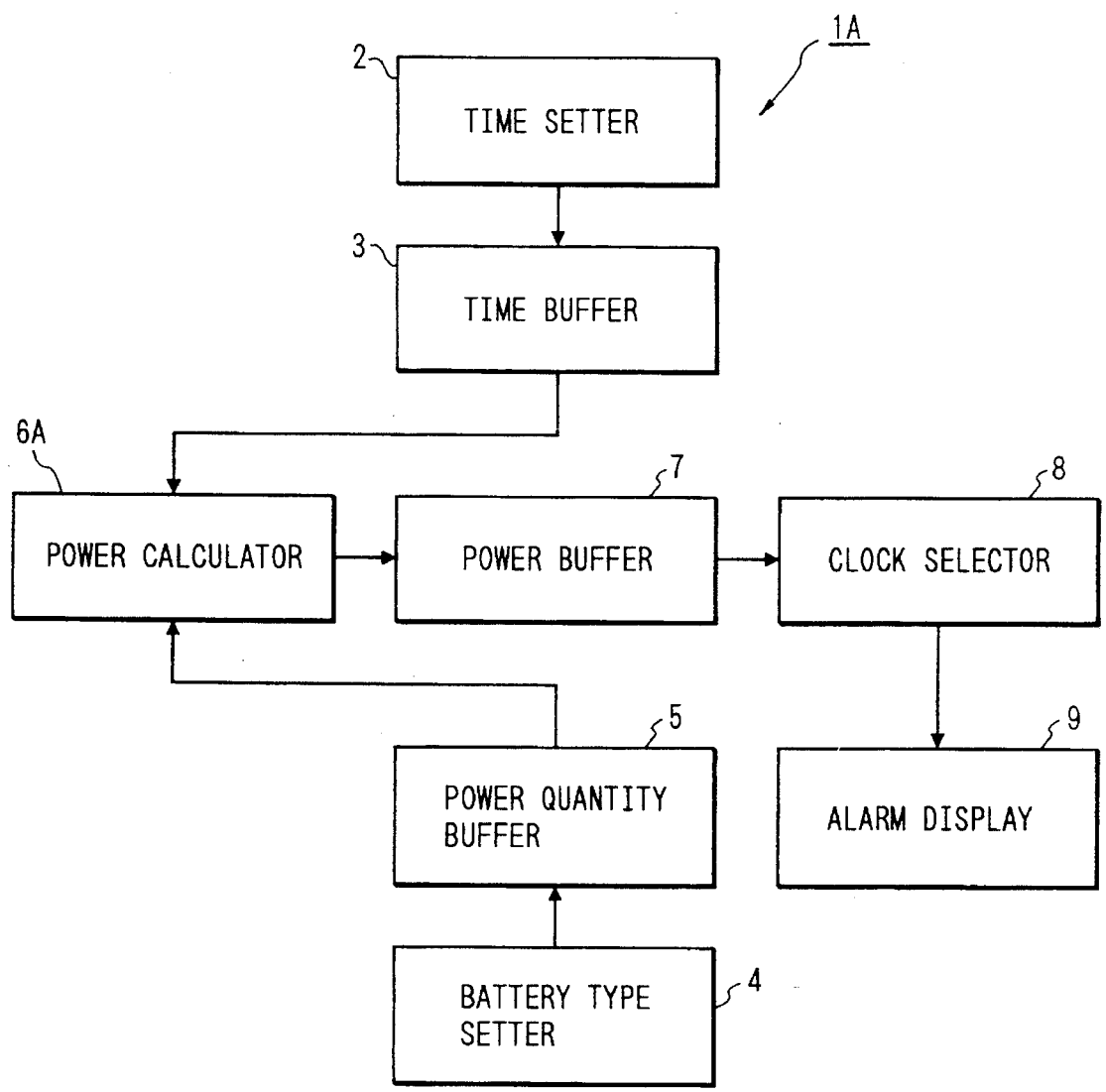
FIG. 1 is a block diagram showing the first embodiment of a power manager of the invention.

FIG. 1 is a block diagram showing the first embodiment of the power manager of the invention.

The power manager 1A comprises: a time setter 2; a time buffer 3; a battery type setter 4; a power quantity buffer 5; a power calculator 6A; a power buffer 7; the clock selector 8; and an alarm display 9.

Figure 5:
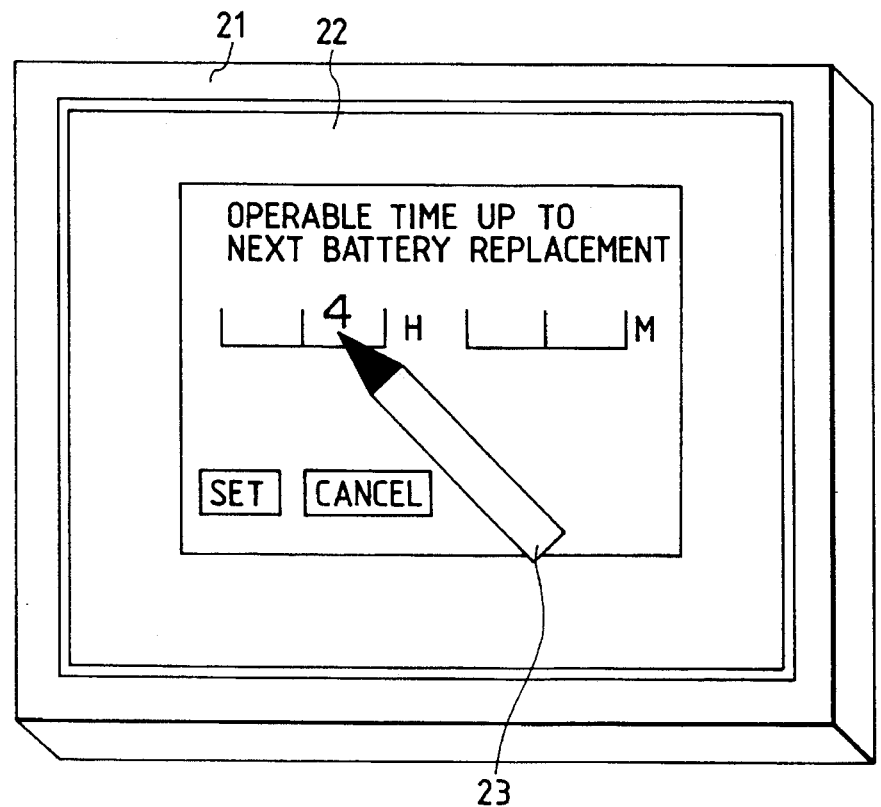
FIG. 5 is a display screen to explain the operation of a time setter.

The time setter 2 recognizes, as a character, a value of an operable time until a next battery replacement which was written by the pen 23 for the display screen shown in FIG. 5 and sets into the time buffer 3. Since variable methods regarding the character recognition have been proposed, the detailed description is omitted here.

Figures 6, 7:
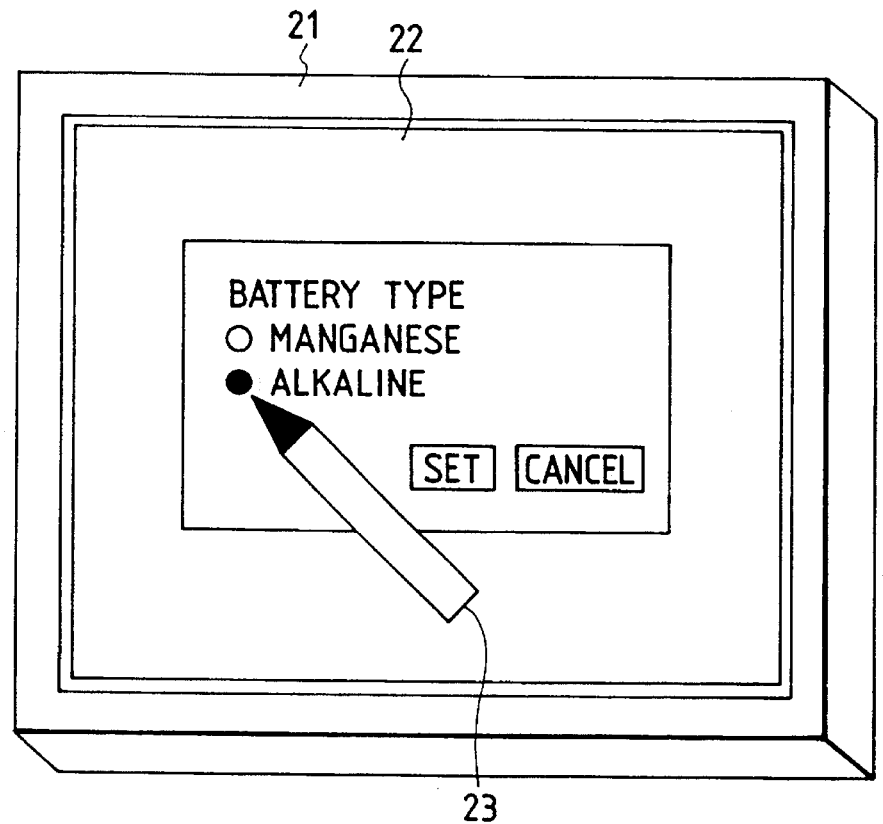
FIG. 6 is a display screen to explain the operation of a battery type setter.
FIG. 7 is a table showing the relation between a battery type and a power quantity.

When one battery type such as manganese battery, alkaline battery, or the like is selected by the pen 23 for the display screen shown in FIG. 6, the battery type setter 4 adds a black circle mark "●" to the selected type and a blank circle mark "o" to the others. The battery setter 4 also obtains a value of a power quantity corresponding to the selected battery type by a table shown in FIG. 7 and sets into the power quantity buffer 5.

The power calculator 6A divides the value set in the power quantity buffer 5 by the value set in the time buffer 3, thereby obtaining a power consumption of the whole apparatus so that the apparatus can be used until the next battery replacement. The power calculator 6A sets the obtained power consumption into the power buffer 7.

Figure 8:
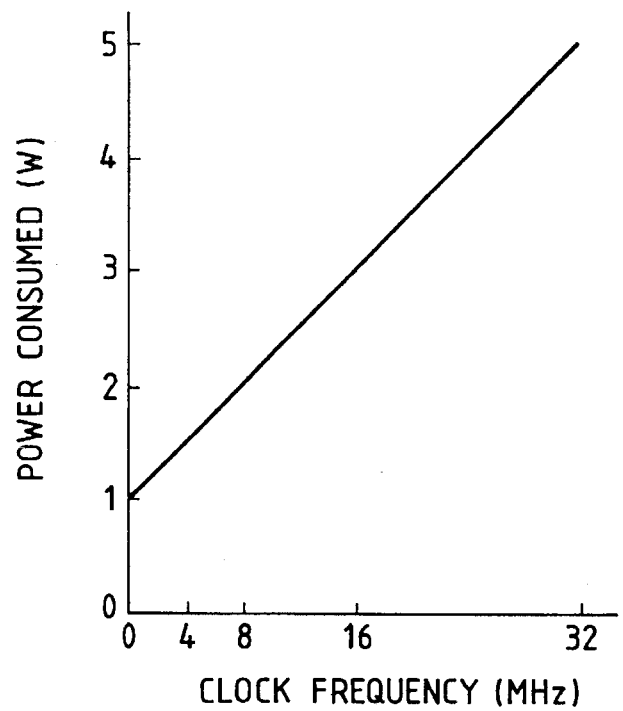
FIG. 8 is a graph showing the relation between a clock frequency and a power consumption of the whole apparatus.

Assuming that a clock frequency and a power consumption of the whole apparatus have the relation shown in a graph of FIG. 8, the clock selector 8 can select the value of either one of the clock frequencies 32 MHz, 16 MHz, 8 MHz, and 4 MHz within a range in which the power consumption doesn't exceed the value that was set in the power buffer 7.

Figure 9:
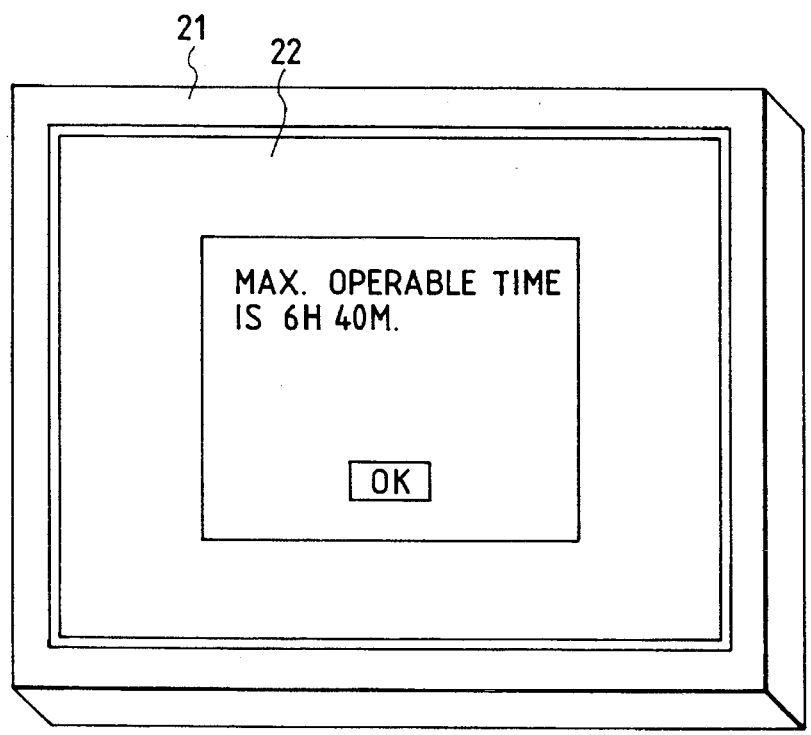
FIG. 9 is a display screen to explain the operation of an alarm display.

In the case where even if the lowest value of 4 MHz is selected by the clock selector 8, the power consumption exceeds the value set in the power buffer 7, since the apparatus cannot be used for the time that was input by the time setter 2, the alarm display 9 displays an alarm message as shown in FIG. 9 in the display 32.

Subsequently, the operation of the first embodiment will now be explained with reference to FIG. 10.

Figures 10, 12:
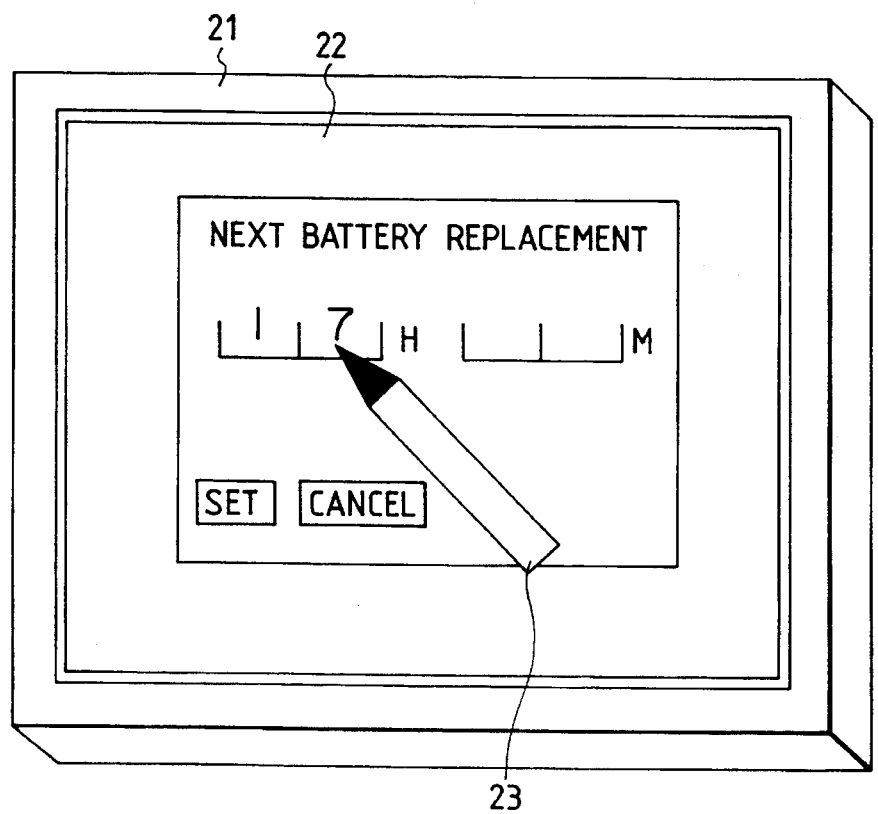
FIG. 10 is a diagram showing the relations among a clock frequency, a power consumption of the whole apparatus, and an operable time.
FIG. 12 is a display screen to explain the operation of a time setter.

It is now assumed that the relations among the clock frequency, the power consumption of the whole apparatus, and the operable time are as shown in FIG. 10.

When the battery type setter 4 selects a manganese battery at the time when a power quantity is equal to 5 W, the clock selector 8 selects the clock frequency of either one of 32 MHz in the case where the operable time which was input by the time setter 2 lies within one hour, 16 MHz in the case where the operable time exceeds 1 hour and lies within 1 hour and 40 minutes, 8MHz in the case where the operable time exceeds 1 hour and 40 minutes (hereinafter, simply referred to as 1H 40M) and lies within 2H 30M, and 4 MHz in the case where the operable time exceeds 2H 30M and lies within 3H 20M. If the operable time exceeds 3H 20M, the alarm display 9 displays an alarm message indicating that the maximum operable time is equal to 3H 20M in the display device 32.

When the battery type setter 4 selects an alkaline battery at the time when the power quantity is equal to 10 W, the clock selector 8 selects the clock frequency of either one of 32 MHz in the case where the operable time which was input by the time setter 2 lies within 2H, 16 MHz in the case where the operable time exceeds 2H and lies within 3H 20M , 8 MHz in the case where the operable time exceeds 3H 20M and lies within 5H, and 4 MHz in the case where the operable time exceeds 5H and lies within 6M 40M . If the operable time exceeds 6M 40M , the alarm display 9 displays an alarm message shown in FIG. 9 in the display device 32.

According to the first embodiment as mentioned above, when a dry battery is replaced, by inputting the operable time of the apparatus until the next replacement and a type of the battery, it is possible to calculate a power consumption of the whole apparatus so that the apparatus can be used until the next battery replacement and to select the corresponding clock frequency.

In the embodiment, although the dry battery has been used as a power source, a storage battery can be also used.

Figure 11:
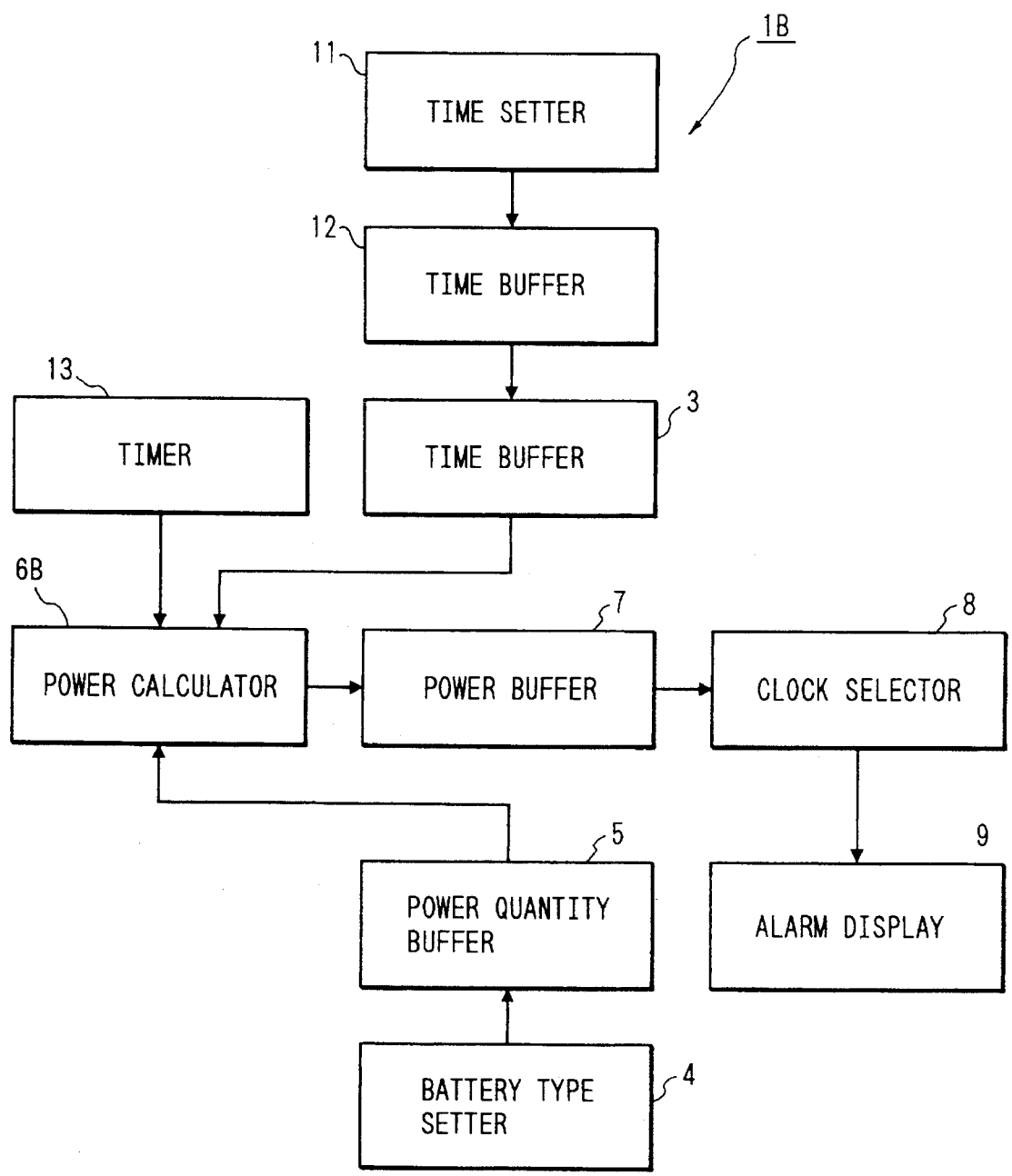
FIG. 11 is a block diagram showing the second embodiment of a power manager of the invention.

FIG. 11 is a block diagram showing the second embodiment of a power manager of the invention.

The power manager 1B has the time buffer 3, the battery type setter 4, the power quantity buffer 5, the power buffer 7, the clock selector 8, and the alarm display 9 which are similar to those of the first embodiment and further has a time setter 11, a time buffer 12, a timer 13, and a power calculator 6B. The power manager 1B doesn't input the operable time of the apparatus until the next battery replacement as in the first embodiment but inputs the time of the next battery replacement as shown in a display screen in FIG. 12.

The time setter 11 recognizes, as a character, the value of the time of the next battery replacement which was written by the pen 23 onto a display screen shown in FIG. 12 and sets into the time buffer 12.

The timer 13 Generates the present time which was counted up every one second to the power calculator 6B.

The power calculator 6B obtains a difference between the time set in the time buffer 12 and the time from the timer 13 and sets the obtained time into the time buffer 13 and further, obtains the residual power quantity every time the power changes and sets into the power buffer 7. Namely, the value (residual power quantity) which is obtained by subtracting [power×time (time which was set in the time buffer 3)] as a power consumption from the power quantity which was set in the power quantity buffer 5 is set every time the power changes. On the other hand, the power calculator 6B determines a power distribution until the set time on the basis of the value and the power quantity which were set in the power quantity buffer 5, thereby setting into the power buffer 7.

Figure 13:
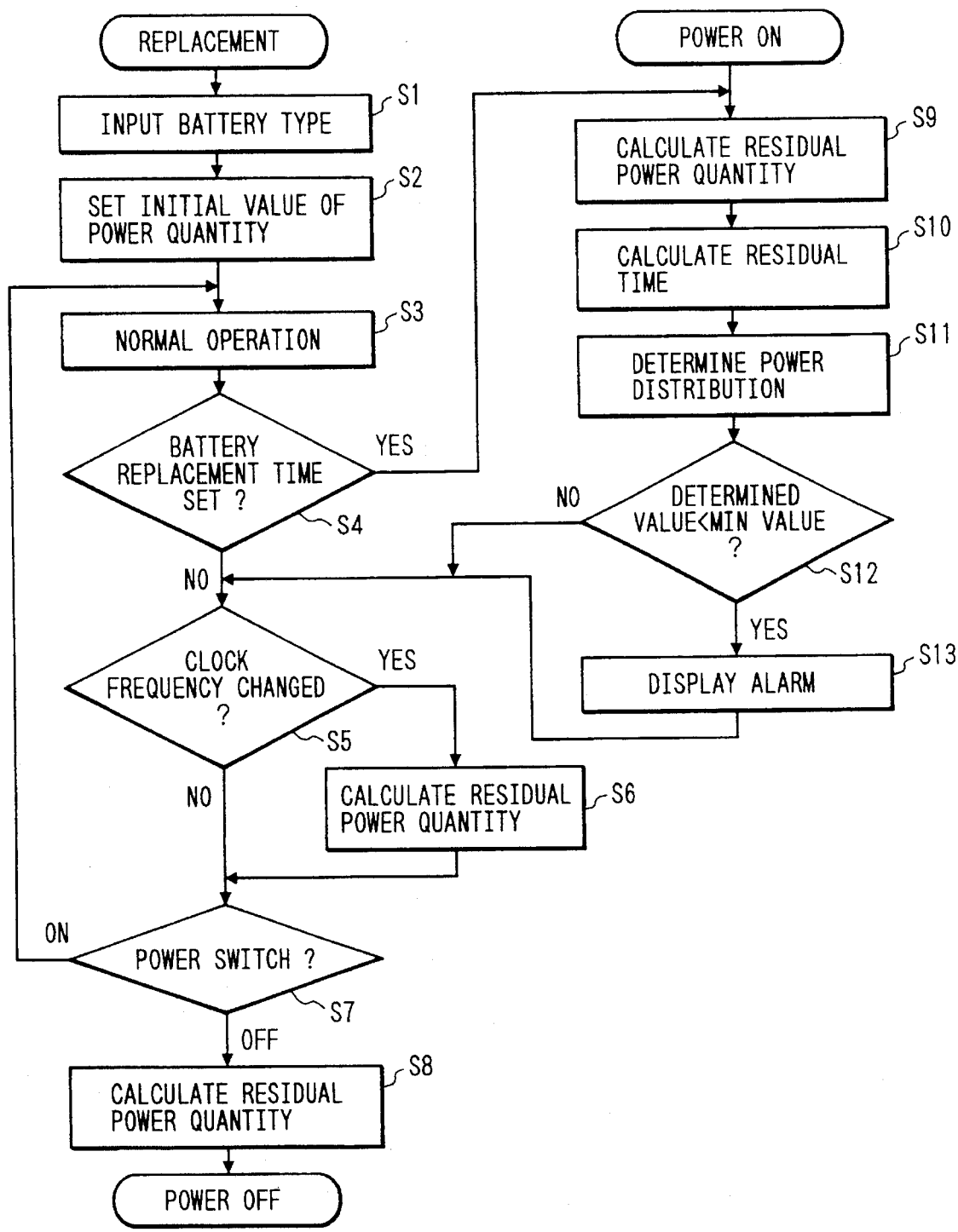
FIG. 13 is a flowchart showing the operation of the second embodiment of the invention.

The operation of the second embodiment will now be described in accordance with a flowchart of FIG. 13.

After the battery replacement, a battery type is input by the battery type setter 4 (S1).

The battery type setter 4 sets the initial value of the power quantity into the power quantity buffer 5 according to FIG. 7 (S2).

The normal operation as a present electronic apparatus is performed (S3).

When there is an input by the time setter 11, the time setter 11 sets the next battery replacement time into the time buffer 12 (S4) and step S9 follows. If NO, step S5 follows.

In step S5, when the time to change the frequency comes, the frequency is changed and the power calculator 6B calculates the residual power quantity (S6). When the consumed power quantity is subtracted from the value in the power quantity buffer 5, the value of the power quantity buffer 5 indicates the residual power quantity. The consumed power quantity is equal to the product of the time from the time when the preceding power quantity was calculated to the present time and the power.

In step S7, a power switch is checked. If the power switch has been turned on, the normal operation is continued in step S3.

If OFF, a residual power quantity is calculated in a manner similar to step S6 and is set into the power quantity buffer 5 and, after that, the power source is disconnected (S8).

In the case where the power source is again turned on, the processing routine is started from step S9.

In step S9, a residual power quantity is also calculated in a manner similar to step S6 and is set into the power quantity buffer 5.

The power calculator 6B obtains a difference between the next battery replacement time which was set in the time buffer 12 and the present time from the timer 13 and sets into the time buffer 3 (S10).

The power calculator 6B determines power distribution until the set time on the basis of the value and the power quantity which were set in the power quantity buffer 5 (S11). The details will be described hereinlater.

In step S12, in the case where the determined power value is less than the minimum value which can be set, the alarm display 9 displays an alarm message in the display device 32 (S13). Since there is a case where the value is returned within a range which can be set while the apparatus is intermittently used, the value is set to the minimum value and the process is continued. However, in this case, there is a fear such that the battery power is extinguished before the next battery replacement.

Subsequently, step S5 follows. When the time to change the frequency comes, the frequency is changed.

The deciding method of the power distribution in step S11 mentioned above will now be described with respect to two cases as examples.

The first method is a method such that a value which doesn't exceed the value obtained by dividing the residual power quantity by the maximum residual time is used as an electric power and whereby the electric power is held constant in case of continuously using the battery without turning off the power source during the operation.

Figure 14:
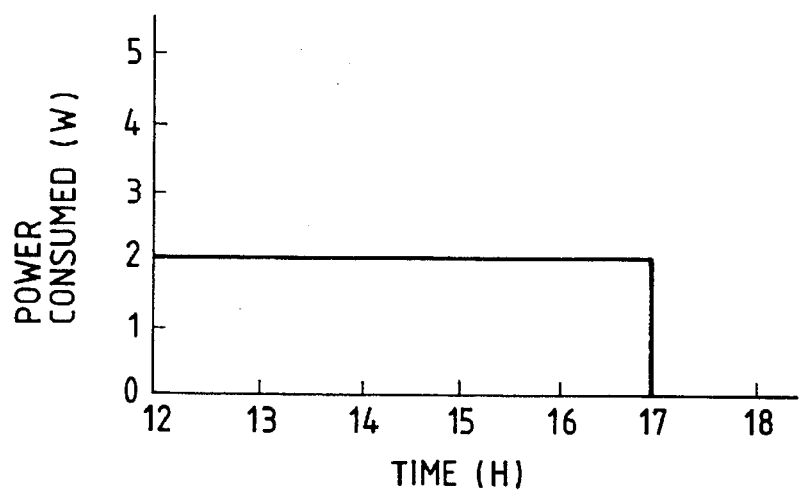
FIG. 14 is a graph showing a power distribution schedule at 12:00 according to an example of the first power distributing method.
Figure 15:
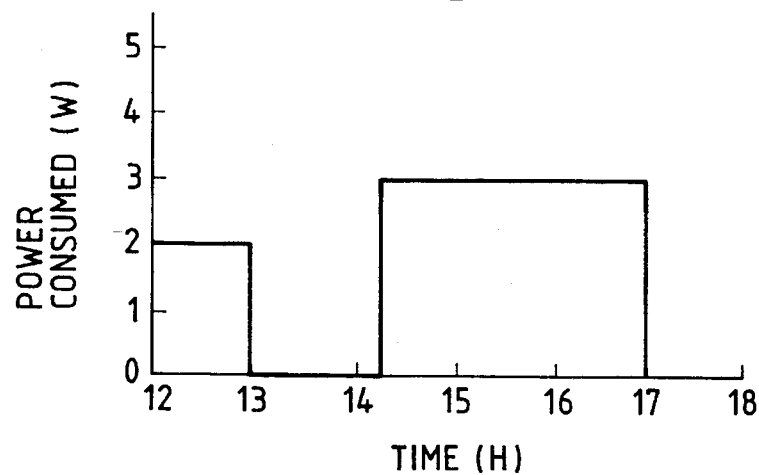
FIG. 15 is a graph showing a power distribution result and a power distribution schedule at 14:20 according to an example of the first power distributing method.
Figure 16:
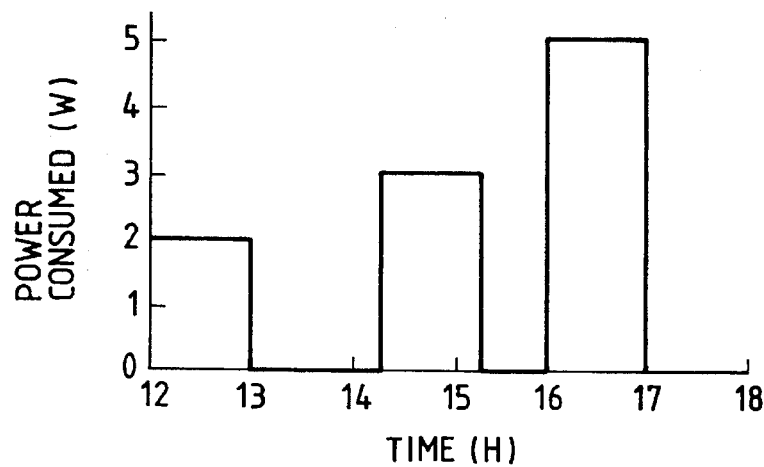
FIG. 16 is a graph showing a power distribution result and a power distribution schedule at 16:00 according to an example of the first power distributing method.

FIGS. 14, 15, and 16 show examples in case of inputting information such that the battery is changed at 12:00 and the next battery replacement is executed at 17:00 and the alkaline battery is used.

The initial value of the power quantity of the alkaline battery is set to ten watts hour (hereinafter, simply referred to as "10 Wh") according to FIG. 7. Assuming that the apparatus is continuously used till 17:00, since the operable time is equal to 5 hours, so long as a power consumption which is equal to or lower than 2 W (=10 Wh÷5 hours), the apparatus can be continuously used. Therefore, the initial value of the electric power is set to 2 W as shown in FIG. 14. It is sufficient that the clock frequency is set to 8 MHz according to FIG. 8.

After that, as shown in FIG. 15, it is assumed that the power source is once turned off at 13:00 and is again turned on at 14:20. Since the consumed power quantity for the time from 12:00 to 13:00 is equal to (2 watts×1 hour =) 2 Wh, the residual power quantity is equal to (10 Wh −2 Wh =) 8 Wh. Since the residual time at 14:20 is equal to 2 hours and 40 minutes (2H 40M) in maximum, in case of the electric power of (8 Wh ÷2H 40M=) 3 W, the apparatus can be continuously used until the next battery replacement. It is sufficient that the clock frequency is set to 16 MHz according to FIG. 8.

After that, as shown in FIG. 16, it is assumed that the power source is once turned off at 15:20 and is again turned on at 16:00. Since the consumed power quantity for the time from 14:20 to 15:20 is equal to (3 W×1H =) 3 Wh, the residual power quantity is equal to (8 Wh −3 Wh =) 5 Wh. Since the residual time at 16:00 is equal to one hour in maximum, in case of the electric power of (5 Wh÷1H =) 5 W, the apparatus can be continuously used until the next battery replacement. It is sufficient to set the clock frequency to 32 MHz according to FIG. 8.

It is a feature of the above method that the lowest frequency is raised. The above method is effective in the case where the user doesn't want to use a low frequency such as 4 MHz or the like as possible and a middle frequency such as 16 MHz or the like is permitted. For instance, in the above example, when the frequency is determined to 8 MHz at 12:00, it will be never set to a frequency less than 8 MHz after that. Similarly, when the frequency is determined to 16 MHz at 14:20, it will never be set to a frequency less than 16 MHz after that. As a time during which the power source is OFF in the halfway is longer, it is possible to switch the frequency to a higher frequency at the time when the power source is again turned on.

The second method is a method such that the maximum value which can be obtained as an electric power is first set to the initial value and, after the elapse of a certain time, the value is switched to the minimum value which can be obtained as an electric power.

Figure 17:
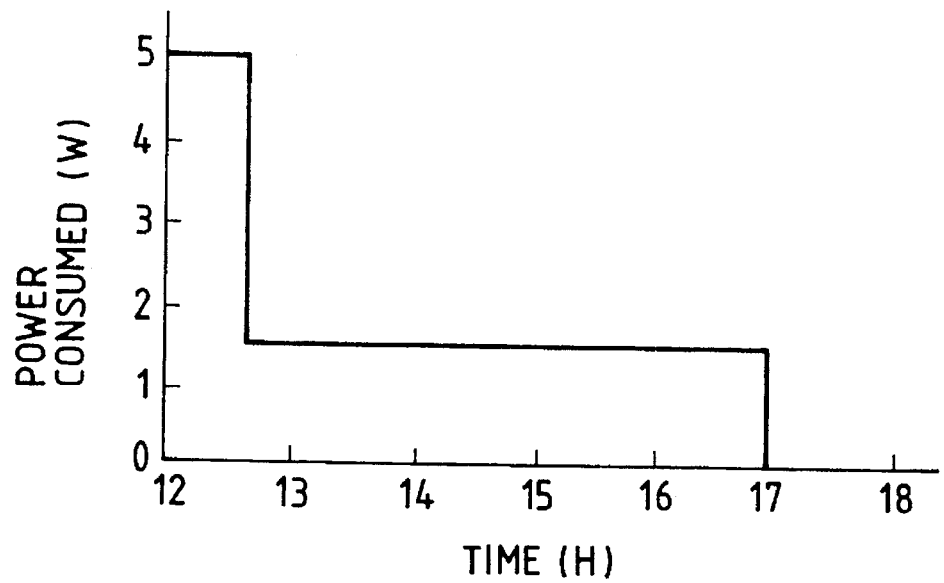
FIG. 17 is a graph showing a power distribution schedule at 12:00 according to an example of the second power distributing method.
Figure 18:
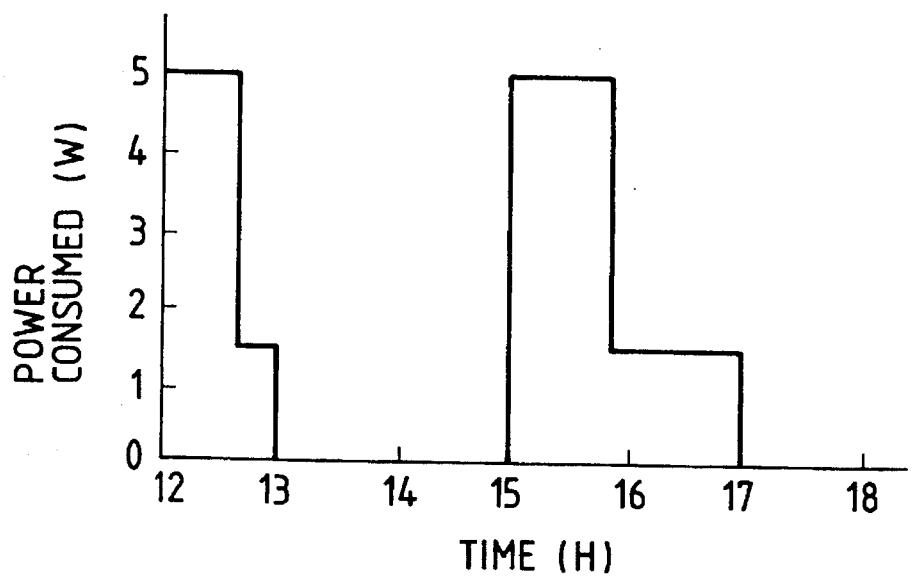
FIG. 18 is a graph showing a power distribution result and a power distribution schedule at 15:00 according to an example of the second power distributing method.

FIGS. 17 and 18 show examples in case of inputting information such that the battery is replaced at 12:00 and the next battery replacement is performed at 17:00 and the alkaline battery is used.

The initial value of the power quantity of the alkaline battery is set to 10Wh according to FIG. 7. On the other hand, it is assumed that the power of five watts (5 W) of the maximum power quantity is set to the initial value according to FIG. 8 and, after the elapse of (t) hours, the value is switched to 1.5 W of the minimum power quantity and the apparatus is continuously used till 17:00. The sum of the operable time is equal to 5 hours. (t) is obtained by the following equation.

$$5 \text{ W} \times t \text{ hours} + 1.5 \text{ W} \times (5 \text{ hours} - t \text{ hours}) = 10 \text{ Wh}$$

According to the equation, t=5/7 hours, namely, about 42 minutes. Therefore, as shown in FIG. 17, the apparatus can be continuously used at 5 W from 12:00 to 12:42. The clock frequency can be set to 32 MHz according to FIG. 8. The electric power is switched to 1.5 W at 12:42. It is sufficient that the clock frequency is set to 4 MHz according to FIG. 8.

After that, as shown in FIG. 18, it is assumed that the power source is once turned off at 13:00 and is again turned on at 15:00.

The power quantity consumed for the time from 12:00 till 12:42 is [5 W×(5/7) hour =](25/7)Wh and the power quantity consumed for the time from 12:42 until 13:00 is [1.5 W×(2/7) hour =](3/7)Wh, so that the sum is equal to 4 Wh. The residual power quantity is (10 Wh −4 Wh =) 6 Wh. Since the residual time at 15:00 is equal to 2 hours in maximum, when it is assumed that the power consumption is switched from 5 W to 1.5 W after the elapse of (t) hours, $$5 \text{ W} \times t \text{ hours} + 1.5 \text{ W} \times (2 \text{ hours} - t \text{ hours}) = 6 \text{ W}$$

According to the above equation, t=6/7 hour, namely, about 51 minutes. Therefore, the apparatus can be continuously used at five watts for the time from 15:00 till 15:51. It is sufficient to set the clock frequency to 32 MHz according to FIG. 8. The electric power is switched to 1.5 W at 15:51. The clock frequency is set to 4 MHz according to FIG. 8.

It is a feature of the above method that the highest frequency can be used as long as possible. As the time during which the power source is temporarily turned off is longer, the highest frequency can be used for a longer time. Even if the frequency is once switched to the lowest frequency, the highest frequency can be used by intermittently using it after that.

According to the first embodiment, assuming that the apparatus is intermittently used, it is impossible to know how long the apparatus can be used after that. However, according to the second embodiment as mentioned above, by newly calculating a difference between the next battery replacement time and the present time whenever the power source is turned on, how long the apparatus can be used in maximum after that is obtained. As the time during which the power source is temporarily turned off is longer, a ratio of the residual power quantity to the residual time is larger at the time when the power source is again turned on, so that a higher performance can be obtained.

Figure 19:
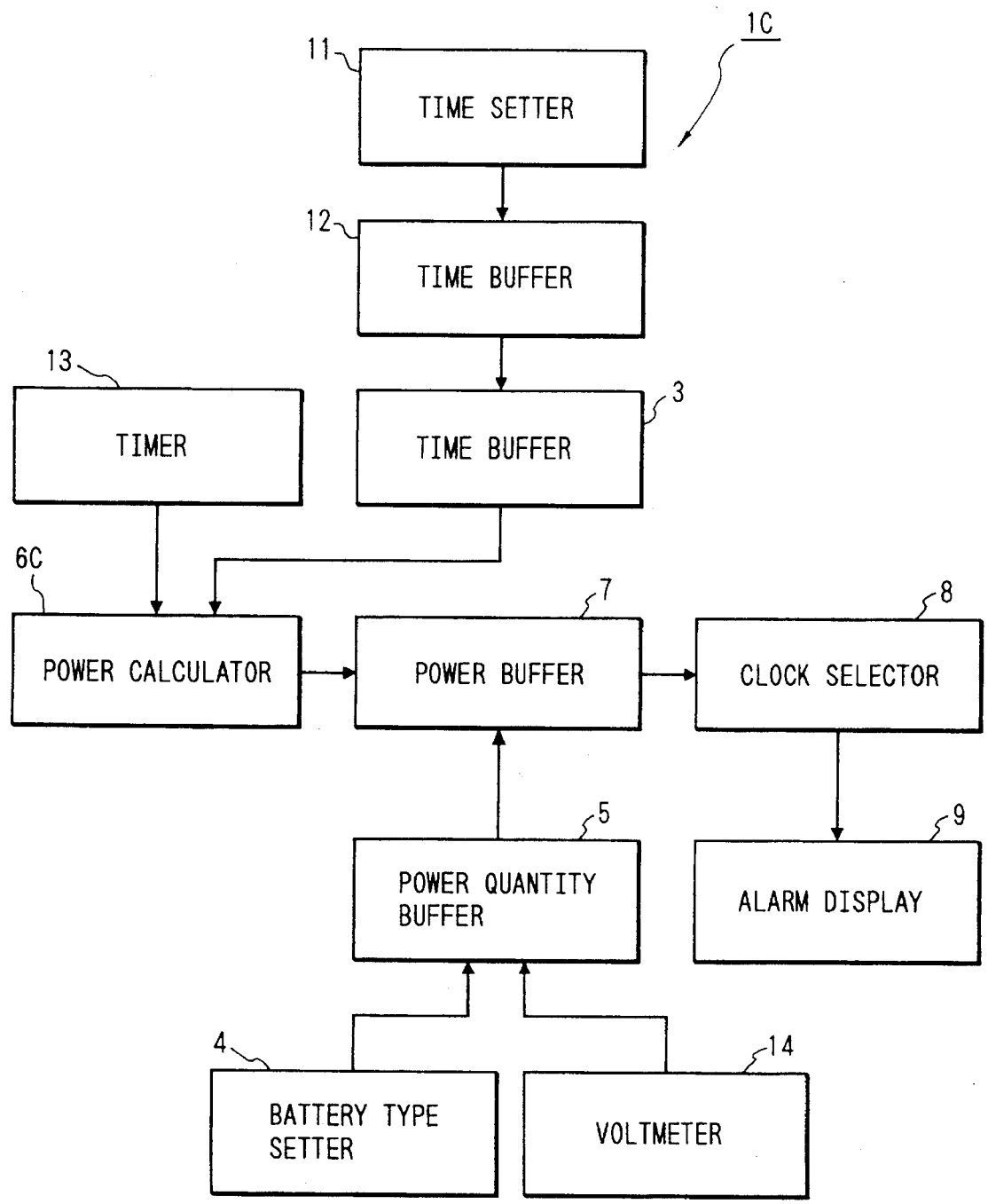
FIG. 19 is a block diagram showing the third embodiment of a power manager of the invention.

FIG. 19 is a block diagram showing the third embodiment of the power manager of the invention.

The power manager 1C has the time buffer 3, battery type setter 4, power quantity buffer 5, power buffer 7, clock selector 8, alarm display 9, time setter 11, time buffer 12, and timer 13 similar to those of the second embodiment and further has a power calculator 6C and a voltmeter 14. The power manager 1C measures a residual power quantity by measuring a battery voltage of the battery. The relation between the residual power quantity and the battery voltage can be shown, for example, like as a graph of FIG. 20.

Figure 20:
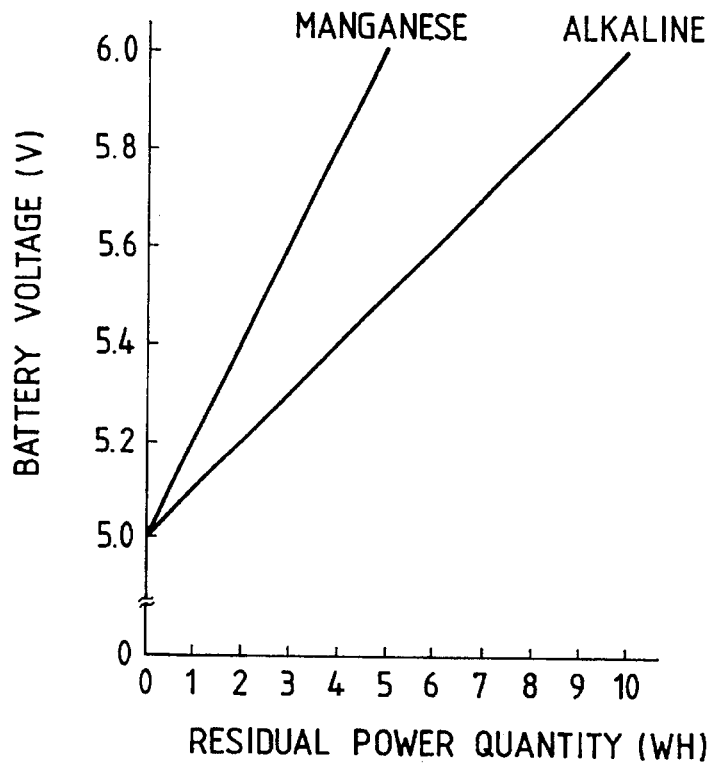
FIG. 20 is a graph showing the relation between a terminal voltage of a battery and a residual power quantity.

The power calculator 6C obtains the residual power quantity from the battery voltage measured by the voltmeter 14 on the basis of the graph of FIG. 20 at every predetermined time or each time the battery voltage is set to a predetermined value. The calculator 6C sets the residual power quantity into the power quantity buffer 5, thereby determining an electric power.

According to the third embodiment as mentioned above, since it is unnecessary to set the initial value of the power quantity, even in case of using an old battery, there is an effect such that the present embodiment can be applied.

Figure 21:
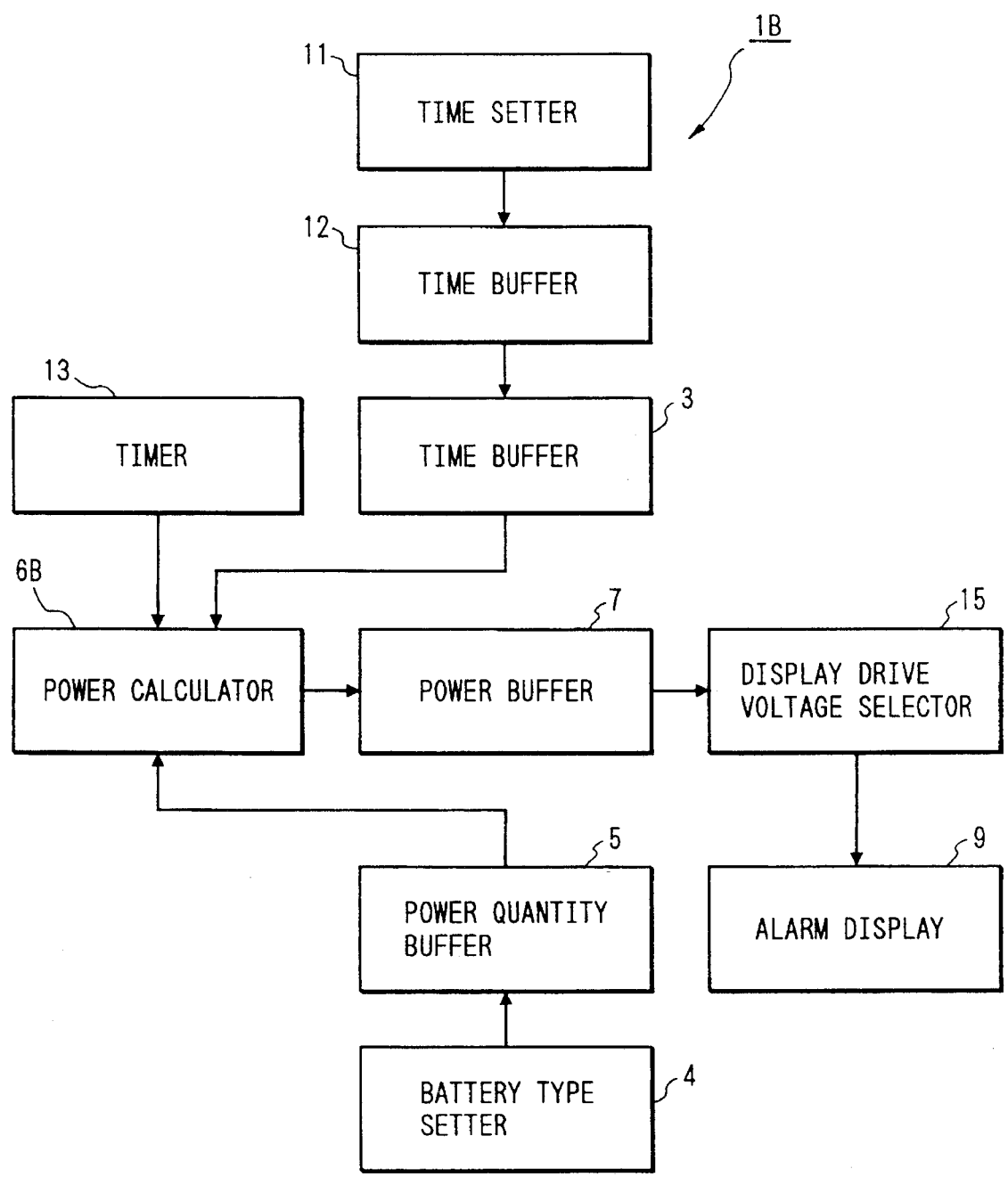
FIG. 21 is a block diagram showing the fourth embodiment of a power manager of the invention.

FIG. 21 is a block diagram showing the fourth embodiment of a power manager of the invention.

Figure 22:
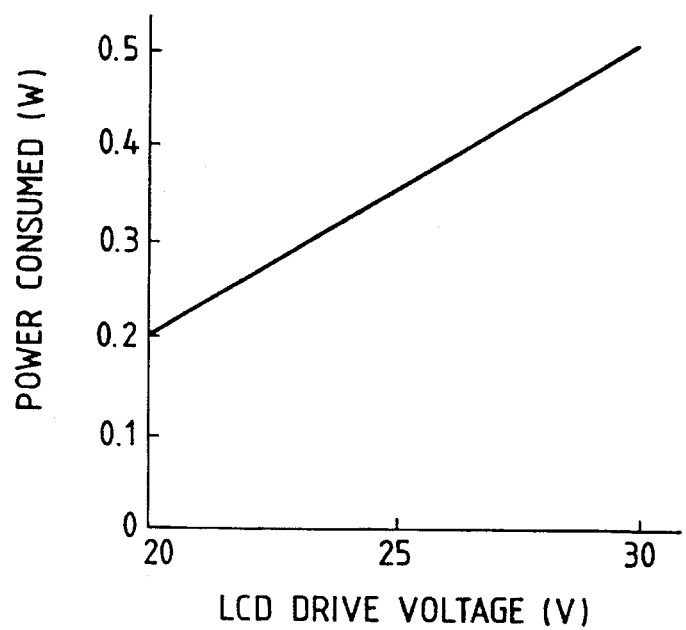
FIG. 22 is a graph showing the relation between a liquid crystal drive voltage and a power consumption.

A power manager 1D has a display drive voltage selector 15 in place of the clock selector 8 in the second embodiment and the others are constructed in a manner similar to those of the second embodiment. As an element which determines a power consumption of the apparatus, for example, other than the clock frequency, a luminance of the display screen is used. The relation between the liquid crystal drive voltage for controlling the luminance of the liquid crystal display and the power consumption is shown, for example, like a graph of FIG. 22. Therefore, as shown in the block diagram of FIG. 21, the invention can be embodied by providing the display drive voltage selector 15 for switching the liquid crystal drive voltage instead of the clock selector 8 in the foregoing third embodiment. On the other hand, with respect to the other elements for determining the power consumption, the invention can be also similarly embodied. For example, a drive frequency of a liquid crystal display, a drive voltage or a frequency of a back light, a velocity of a hard disk or a floppy disk, the number of a plurality of memories and a CPU, and the like can be mentioned.

The present embodiment can be also embodied by the CPU 33 by the program which has previously been set in the ROM 34. A circuit for realizing each section can be also constructed.

The present invention is not limited to the foregoing embodiments but many modifications and variations are possible within the spirit and scope of the appended claims of the invention.

As mentioned above, since the performance of the electronic apparatus is managed so that the electric power which is actually consumed does not exceed the power consumption obtained from the calculations, the power manager which can supply the electric power for at least the set time can be provided.

What is claimed is:

1. A power managing apparatus in an electronic apparatus using a battery comprising:

residual quantity detecting means for detecting a residual quantity of the battery;

setting means for setting a time; and judging means for judging whether the electronic apparatus can be driven until the set time on the basis of the residual quantity of the battery detected by said residual quantity detecting means.

2. An apparatus according to claim 1, wherein the set time is an operable time of the electronic apparatus.

3. An apparatus according to claim 1, wherein the set time is an operable time obtained from a next charging time.

4. An apparatus according to claim 1, wherein the set time includes a pen input.

5. A power managing apparatus comprising:

residual quantity detecting means for detecting a residual quantity of a battery;

forming means for forming a plurality of frequencies;

setting means for setting a time; and selecting means for selecting said plurality of frequencies on the basis of the set time and the detected residual quantity.

6. An apparatus according to claim 5, wherein the set time is an operable time of an electronic apparatus.

7. An apparatus according to claim 5, wherein the set time is an operable time obtained from a next charging time.

8. An apparatus according to claim 5, wherein the set time includes a pen input.

9. An apparatus according to claim 5, further comprising:

judging means for judging whether an electronic apparatus can be driven until the set time on the basis of the residual quantity of the battery detected by said residual quantity detecting means; and notifying means for notifying a result of the judgment.

10. An electronic apparatus comprising:

input means for inputting time information;

displaying means for displaying said input time information;

power means for supplying an electric power;

detecting means for detecting a residual quantity of said power means;

forming means for forming a plurality of frequencies; and selecting means for selecting said formed plurality of frequencies on the basis of the input time information and the detected residual quantity.

11. An apparatus according to claim 10, wherein the input time information represents an operable time of the electronic apparatus.

12. An apparatus according to claim 10, wherein the input time information represents an operable time obtained from a next charging time.

13. An apparatus according to claim 10, wherein the input time information includes a pen input.

14. An apparatus according to claim 10, further comprising:

judging means for judging whether the electronic apparatus can be driven until a time represented by the input time information on the basis of the residual quantity of said power means detected by said residual quantity detecting means; and notifying means for notifying a result of said judgment.

15. A power managing method in an electronic apparatus using a battery, comprising the steps of:

setting a time;

detecting a residual quantity of the battery; and judging whether the electronic apparatus can be driven until the set time on the basis of the detected residual quantity of the battery.

16. A power managing method comprising the steps of:

setting a time;

detecting a residual quantity of a battery; and selecting a plurality of formed frequencies on the basis of the set time and the detected residual quantity.

17. An apparatus according to claim 1, further comprising notifying means for notifying a judgment result by said judgment means.

18. A method according to claim 15, further comprising the step of notifying a judgment result in said judgment step.

19. A power managing apparatus in an electronic apparatus using a battery comprising:

residual quantity detecting means for detecting a residual quantity of the battery;

setting means for setting a time duration; and judging means for judging whether the electronic apparatus can be driven in the set time duration on the basis of the residual quantity of the battery detected by said residual quantity detecting means.

20. An apparatus according to claim 19, further comprising notifying means for notifying a judgment result by said judgment means.

21. An apparatus according to claim 19, wherein the set time duration is an operable time duration of the electronic apparatus.

22. An apparatus according to claim 19, wherein the set time duration is an operable time duration obtained from a next charging time.

23. An apparatus according to claim 19, wherein the set time duration includes a pen input.

24. A power managing method in an electronic apparatus using a battery, comprising the steps of:

setting a time;

detecting a residual quantity of the battery;

setting means for setting a time duration; and judgment whether the electronic apparatus can be driven in the set time duration on the basis of the detected residual quantity of the battery.

25. A method according to claim 24, further comprising the step of notifying a judgment result in said judgment step.

26. A method according to claim 24, wherein the set time duration is an operable time duration of the electronic apparatus.

27. A method according to claim 24, wherein the set time duration is an operable time duration obtained from a next charging time.

* * * * *

UNITED STATES PATENT AND TRADEMARK OFFICE
CERTIFICATE OF CORRECTION

PATENT NO. : 5,600,228

DATED : February 4, 1997

INVENTORS : KAZUHIRO MATSUBAYASHI ET AL.

It is certified that error appears in the above-identified patent and that said Letters Patent is hereby corrected as shown below:

COLUMN 4

Line 28, "6M 40M." should read --6H 40M.--;
Line 29, "6M 40M," should read --6H 40M,--;
Line 58, "Generates" should read --generates--.

COLUMN 6

Line 45, "be never" should read --never be--.

COLUMN 8

Line 23, "be also" should read --also be--;

UNITED STATES PATENT AND TRADEMARK OFFICE
CERTIFICATE OF CORRECTION

PATENT NO. : 5,600,228

DATED : February 4, 1997

INVENTORS : KAZUHIRO MATSUBAYASHI ET AL.

Page 2 of 2

It is certified that error appears in the above-identified patent and that said Letters Patent is hereby corrected as shown below:

<u>COLUMN 8</u>

Line 28, "be also" should read --also be--;
Line 30, "be also" should read --also be--.

Signed and Sealed this

First Day of July, 1997

Attest:

BRUCE LEHMAN

*Attesting Officer*    *Commissioner of Patents and Trademarks*